United States Patent
Huch

(10) Patent No.: US 10,170,200 B2
(45) Date of Patent: Jan. 1, 2019

(54) MEMORY DEVICE AND METHOD FOR TESTING A MEMORY DEVICE

(71) Applicant: Infineon Technologies AG, Neubiberg (DE)

(72) Inventor: Martin Huch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/387,780

(22) Filed: Dec. 22, 2016

(65) Prior Publication Data

US 2017/0206982 A1    Jul. 20, 2017

(30) Foreign Application Priority Data

Jan. 15, 2016   (DE) ........................ 10 2016 100 630

(51) Int. Cl.
| | |
|---|---|
| *G11C 29/56* | (2006.01) |
| *G11C 29/44* | (2006.01) |
| *G11C 11/417* | (2006.01) |
| *G11C 29/36* | (2006.01) |
| *G11C 29/42* | (2006.01) |
| *G11C 29/52* | (2006.01) |

(52) U.S. Cl.
CPC ............ *G11C 29/44* (2013.01); *G11C 11/417* (2013.01); *G11C 29/36* (2013.01); *G11C 29/42* (2013.01); *G11C 29/52* (2013.01)

(58) Field of Classification Search
CPC ..................................................... G11C 29/56
USPC ......................................... 714/719, 711, 718
See application file for complete search history.

(56) References Cited

U.S. PATENT DOCUMENTS

| | | | |
|---|---|---|---|
| 5,305,261 A * | 4/1994 | Furutani | G11C 29/02 365/149 |
| 8,120,960 B2 * | 2/2012 | Varkony | G11C 5/145 365/185.16 |
| 2005/0160332 A1 | 7/2005 | Hirabayashi | |
| 2011/0191648 A1 | 8/2011 | Suzuki | |
| 2014/0241076 A1 * | 8/2014 | Kwon | G11C 29/12005 365/189.09 |
| 2016/0283339 A1 * | 9/2016 | Yamate | G06F 11/1016 |

* cited by examiner

*Primary Examiner* — Fritz Alphonse
(74) *Attorney, Agent, or Firm* — Viering, Jentschura & Partner MBB

(57) ABSTRACT

According to one embodiment, a memory device is provided including a plurality of data word memories, a test controller configured to, for each data word memory, read a data word stored in the data word memory, check the read data word to detect an error of the memory device, determine a complementary data word of the data word, store the complementary data word in the data word memory, read the complementary data word from the data word memory and check the read complementary data word to detect an error of the memory device.

21 Claims, 5 Drawing Sheets

MEMORY DEVICE AND METHOD FOR TESTING A MEMORY DEVICE

CROSS-REFERENCE TO RELATED APPLICATION

This application claims priority to German Patent Application Serial No. 10 2016 100 630.0, which was filed Jan. 15, 2016, and is incorporated herein by reference in its entirety.

TECHNICAL FIELD

The present disclosure relates to memory devices and methods for testing a memory device.

BACKGROUND

An electronic device such as a microcontroller may be applied in a context where it is critical that data stored in its memory is correctly stored. Therefore, the electronic device may be configured to periodically perform a test of its memory according to a test method. Test methods should usually be able to detect a wide range of errors, i.e. test coverage should be good. Further, it may be desirable that the test is non-destructive, i.e. that data stored before the test in the memory is not destroyed by the test.

SUMMARY

According to one embodiment, a memory device is provided including a plurality of data word memories, a test controller configured to, for each data word memory, read a data word stored in the data word memory, check the read data word to detect an error of the memory device, determine a complementary data word of the data word, store the complementary data word in the data word memory, read the complementary data word from the data word memory and check the read complementary data word to detect an error of the memory device.

Further, a method for testing a memory device according to the above memory device is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

An electronic device such as a microcontroller, an embedded computer etc. may, depending on its application, have high requirements regarding the reliability of its memory, i.e. it may be critical that data stored in the device's memory is not lost. To prevent loss of data, an error correction code (ECC) may be used by the electronic device for detecting and possibly even correcting errors in data words. However, the capability of ECC to cope with errors in this mission-critical data depends (to a large extent) on the hamming distance (HD) of the code. A large hamming distance comes with an increased number of ECC bits and increases the memory access time. In addition, even then, in case of a large hamming not all errors may be corrected or even detected, because the ECC checking is typically only performed when a data word is accessed. The time interval between accessing the same memory location may be very long, such that after this long time, an extra number of errors mat have accumulated in that data word. This may be to the extent that it surpasses the capability of the ECC code.

This issue can be addressed by performing a periodic test of the memory such that errors can be corrected or at least detected before they become critical. In addition, such a test may be designed to also detect latent errors in the memory.

Figure 1:
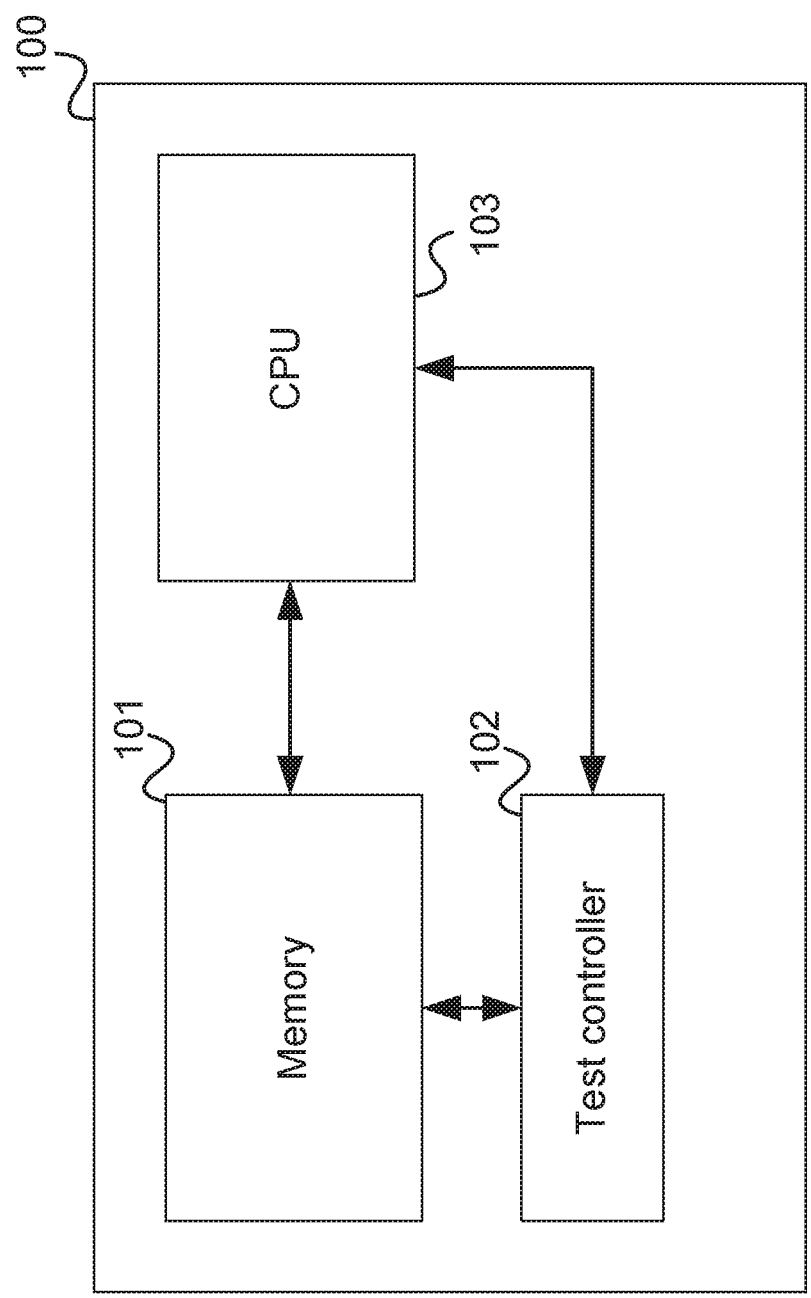
FIG. 1 shows an electronic device having a memory such as a microcontroller.

FIG. 1 shows an electronic device 100.

The electronic device 100 (such as a microcontroller, e.g. for an automotive application) includes a memory 101, a (memory) test controller 102 and a CPU (central processing unit) 103 which controls the test controller 102, e.g. give test instructions to the test controller 102. For example, the CPU 103 may periodically instruct the test controller 102 to perform a memory test (e.g. when the electronic device is running). It may for example also instruct the text controller 102 to perform a memory test when the electronic device 100 is started.

The memory 101 is for example an SRAM (static random access memory).

Figure 2:
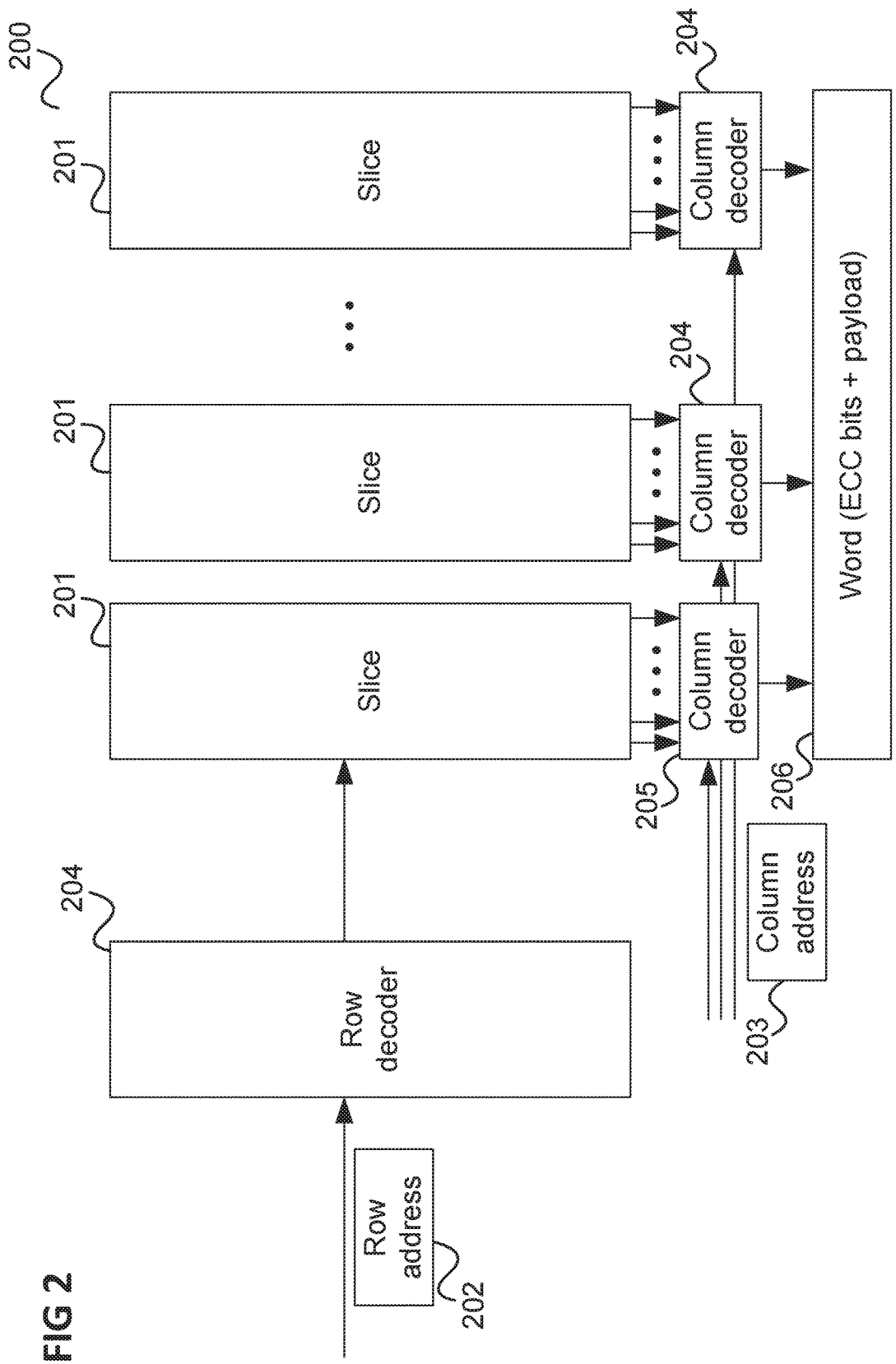
FIG. 2 shows an example for a structure of a memory.

FIG. 2 shows an example for a structure of a memory 200.

The memory includes a plurality of slices 201 wherein the number of slices 201 corresponds to the number of bits of one data word memory (also referred to as word cell in the following). One data word memory serves for storing one data word and ECC bits of the data word (wherein the ECC bits may be seen to be part of the data word itself or may be seen to be stored in the word cell in addition to a data word).

Each slice 201 is an array which includes rows and columns of bit cells. Each bit cell by be addressed by means of a row address 202 and a column address 203. Thus, based on a row address 202 a row decoder 204 may select the addressed row for each slice 201 such that each slice 201 outputs the bits stored in the bit cells of the addressed row. A column decoder 205 (operating as multiplexer in the case of reading from the memory) selects, for each slice, the output bit of the addressed column such that altogether, the column decoders 205 output a word 206 which includes the ECC bits and the payload of a data word, wherein, as mentioned above, the payload without the ECC bits may be considered as the data word or the payload without the ECC bits may be considered as the data word in the embodiments described in the following.

Thus, the row address together with the column address form the address of a word cell. In the following "cell" refers to "word cell" (in contrast to "bit cell"). For example, the address of a word cell is given by the binary value $A_N, A_{N-1}, \ldots, A_0$ wherein each $A_i$ ($i=0, \ldots, N$) is a bit value and $A_j, \ldots, A_0$ is the column address and $A_N, \ldots, A_{j+1}$ is the row address for some j (0≤j<N).

While above, reading from the memory 200 has been described, writing to the memory 200 may be performed analogously, wherein, in the writing operation, the column decoders operate as demultiplexers.

The memory 200 can be of various sizes, e.g. with the following properties:
a. Number of bits per word: from 8 to 137.
b. Number of words that may be stored: from 764 to 8K.
c. The column decoder 205 can have 4, 8 or 16 inputs, i.e. the column address may have 4, 8 or 16 bits.
d. The ECC code has a Hamming Distance of 3, which means that it can correct single bit errors (SBEs) and can detect double bit errors (DBEs).

Memory test algorithms typically have the form of a March test. They can be defined unambiguously, as shown below, using the simple March test MATS+. MATS+ can be written as: $\{\updownarrow (w0)_{M0}; \Uparrow (r0,w1)_{M1}; \Downarrow (r1,w0)_{M2}\}$ The MATS+ algorithm consists of 3 March elements: M0, M1 and M2.
The subscripts, which are not part of the March test, are only used for ease of reference.
The curly brackets "{" and "}" mark the beginning and the end of the test.
The ";" character separates the MEs.
The round brackets "("and")" mark the beginning and the end of the operations of the ME.
A march element consists of a sequence of operations applied to every (word) cell, in either one of two address orders (AOs):
1. Increasing ($\Uparrow$) address order; from cell 0 to cell n−1.
2. Decreasing ($\Downarrow$) address order; from cell n−1 to cell 0.

The $\Uparrow$ address order may be any sequence of addresses (e.g., 5,2,0,1,3,4,6,7), provided that the $\Downarrow$ address order is the exact reverse sequence (i.e., 7,6,4,3,1,0,2,5).

The AO symbol "$\updownarrow$" is used to denote an AO which is irrelevant; i.e., it can be chosen arbitrarily.
Example: $\{\updownarrow (w0)_{M0}; \Uparrow (r0,w1)_{M1}; \Downarrow (r1,w0)_{M2}\}$.

The test has a test length (TL) of 5, because in total 5 operations are applied to every cell.
The address order of M0 is irrelevant (denoted by symbol $\updownarrow$).
M0: $\updownarrow$ (w0) means 'for i=0 to n−1 do A[i]:=0'. n=the number of memory cells.
M1: $\Uparrow$ (r0,w1) means 'for i=0 to n−1 do {read A[i]; A[i]:=1}'.
M2: $\Downarrow$ (r1,w0) means 'for i=n−1 to 0 do {read A[i]; A[i]:=0}'.

The test algorithm together with the algorithm application method (AM) defines a test. In order to apply a test algorithm, additional information is required which is provided by the AM. The AM consists of:
1. A data background (DB).
2. An address direction (AD).
3. A counting method (CM).
4. Operations per March element (OPME).

In order to be able to sensitize and detect faults one has to fill the memory with data; this data is called the data background (DB). Each data background has its own inverse which means that if the DB is all 0's, then the inverse is all 1s.

The following DBs are typically used:
sDB: solid Data Background.
sDB0: The memory is filled with all 0s.
sDB1: The memory is filled with all 1s.
bDB: checkerboard DB.
bDB0: The Memory is filled with an alternating pattern of 01,01,0, . . . /1,0,1,0,1,0, . . . .
bDB1: The Memory is filled with an alternating pattern of 1,0,1,0,1 . . . /0,1,0,1,0 . . . .
rDB: row-stripes DB
The memory is filled with alternating rows of all 0s and all 1s.
rdB0: Fills memory with the alternating rows of 0000 . . . /1111 . . . .
rDB1: Fills memory with the alternating rows of 1111 . . . /0000 . . . .
cDB: column-stripes DB
The memory is filled with alternating columns of all 0s and all 1s.
cdB0: Fills memory with the alternating pattern 0000 . . . /1111 . . . .
cDB1: Fills memory with the alternating pattern 1111 . . . /0000 . . . .
aDB: arbitrary (or application-specific) DB
The memory is filled with an arbitrary set of data values.
aDB: the original set of data values.
a*DB: the inverted set of data values ("*" means inversion).

Because most memories have a two-dimensional structure (as described for the memory 200 having rows and columns), the address modification (i.e., the address incrementing and decrementing) can be done as follows (this is called the Address Direction (AD)):
a. Fast-Column
The column address is modified most frequently; denoted by AO the subscript "C", as e.g. in $_C\Uparrow$.
b. Fast-Row
The row address is modified most frequently; denoted by AO the subscript "R", as e.g. in $_R\Uparrow$.

A counting method (CM) is the way one counts. For example counting 3 objects can be done in 6 different ways: 1,2,3; 1,3,2 or 2,1,3 or 2,3,1 or 3,1,2 or 3,2,1. The CM is denoted by a superscript of the AO, as follows: $^{Li}\Uparrow$.

Several CMs are used for testing memories, only two will be mentioned:
a. The linear CM, for the $\Uparrow$ sequence it counts as follows: 0,1,2,3, etc. For the $\Downarrow$ sequence it counts: . . . , 5,4,3,2,1,0. This is the most frequently used CM because CFs typically occur between adjacent cells. Notation: $^{Li}\Uparrow$.
b. The $2^i$ CM. This CM increments/decrements the address with a number which is a power of 2. E.g., for the case i=3, its increments/decrements the address with $2^3$=8. Notation: $^{2i}\Uparrow$.

The $2^i$ CM requires special hardware support in the address generators.

This CM is used for detecting speed-related faults, as is the case with the moving inversions (MOVI) test, which requires address transitions which a Hamming distance of 2, for all values of i. This means that the test is performed c times, assuming a c-bit address counter.

Regarding the operations per March element (OPME), the MATS+ algorithm example given above is composed of 3 MEs: $\{\updownarrow (w0)_{M0}; \Uparrow (r0,w1)_{M1}; \Downarrow (r1,w0)_{M2}\}$.

For the detection of single-cell faults only the operations and their sequence are relevant. For example the algorithm for detecting SAFs (stuck-at fault errors) can consist of a Single ME, as follows: {⇕(w0,r0,w1,r1)}. Alternatively, it may consist of 2 MEs, as e.g., in {⇕(w0,r0,w1);⇕(r1,w0)}, etc.

In addition to the above sequences, algorithms for single-cell faults also allow the sequence of operations to be reversed, because it is irrelevant which fault will be detected first. For example, the following algorithms may also be used to detect all SAFs: {⇕(w1,r1,w0,r0)} and the algorithm {⇕(w0,r0,w1);⇕(r1)}.

Last, an arbitrary set, of zero or more, operations may be inserted before and after the pairs of operations which are required to detect a subclass of a fault. E.g., as in the algorithm: {⇕( . . . ,w0,r0, . . . ,w1,r1, . . . )}, where by " . . . " represents an arbitrary set (of zero or more) operations.

The above gives an extra degree of freedom in composing algorithms for single-cell faults.

The space of memory (e.g. SRAM) faults consists of many subspaces. In the following, the most common subspaces are described. They are:
1. Single-cell faults: SAF, TF, DRF, SOF.
2. Two-cell faults (Coupling Faults) CFs: CFid, CFst.
3. Speed-related faults.
4. Address decoder Faults: AFs.

These faults are described in the following in more detail:
1. Single-cell faults: SAF, TF, DRF, SOF
In case of a single-cell fault, only a single cell is involved in the fault. It consists of the following subclasses:
1.1 SAF (Stuck-At Fault).
1.2 TF (Transition Fault).
1.3 DRF (Data Retention Fault).
1.4 SOF (Stuck-Open Fault).
1.1 SAF (Stuck-At Fault):
The logic value of a SA cell is always:
0: a SA0 fault; a w1 operation does not change the 0-state of the cell.

Notation: <1/0>; the symbol before the slash shows the sensitizing operation; the fault effect is shown after the slash.
1: a SA1 fault
Notation: <0/1>.

It should be noted that only one fault can be present in a given cell at the same time.

The sensitization and detection of SAFs requires that in each cell a 1 is written and read, and a 0 is written and read.

The algorithms {⇕(w0);⇑(r0,w1);⇓(r1,w0)}, {⇕(w0,r0,w1,r1)} and {⇕(w0,r0,w1);⇕(r1,w0)} all detect SAFs.

The sensitization and detection do not depend on:
The data background (DB); i.e., sDB, bDB, rDB, cDB or aDB.
The address direction (AD); i.e., Fast-Row or Fast-Column ($_R\Downarrow$).
The counting method (CM); e.g., Fast-Row ($^L\Downarrow$)
The operations per March element (OPME).

1.2 TF (Transition Fault):
In case of a transition fault (TF) a cell fails to undergo one or both of the following transitions:
An up transition: an <↑/0>TF; i.e., the cell fails to change from 0 to 1.
A down transition: a <↓/1>TF.
A single cell may contain both faults simultaneously.

The sensitization and detection of CFs requires that in each cell an up-transition (i.e., ↑) is caused followed by a read operation, and a down transition followed by a read operation.

For example, the algorithms {⇕(w0);⇑(r0,w1);⇓(r1,w0,r0)}, and {⇕(w0,r0,w1,r1,w0,r0)} and {⇕(w0,r0,w1,r1,w0,r0)} all detect SAFs.

The sensitization and detection do not depend on:
The data background (DB); i.e., sDB, bDB, rDB, cDB or aDB.
The address direction (AD); i.e., Fast-Row or Fast-Column ($_R\Downarrow$).
The counting method (CM); e.g., the linear CM ($^L\Downarrow$).
The operations per March element (OPME).

1.3 DRF (Data Retention Fault):
In case of a DRF a cell switches state after some time (T), caused by leakage. Because the initial state can be 0 or 1; the following two faults may exist:
The 0-state is lost; notation <$0_T$/1>, after some time T the cell switches to state 1.
The 1-state is lost; notation <$1_T$/0>.

A test algorithm for DRFs typically uses a delay, whereby the delay value Del≥T.

The test has to write a 0 in every cell and read the cells after a time T, similarly a 1 has to be written in the cells and read after a time T.

Because the high memory density, which causes cells to be close to each other, a cell may not only leak to ground or $V_{cc}$, but also to neighboring cells. Therefore the data background (DB) cDB (checkerboard) is typically advantageous.

The algorithm for detecting DRFs is a superset of those for detecting SAFs, whereby delay elements (DEL) are inserted.

For example, the algorithm {⇕(w0);Del;⇑(r0,w1);Del;⇓(r1)} detects DRFs.

The sensitization and detection do not depend on:
The address order (AO); i.e., ⇑ or ⇓.
The address direction (AD); i.e., Fast-Row or Fast-Column ($_C\Downarrow$).
The counting method (CM); e.g., the linear CM ($^L\Downarrow$).
The operations per March element (OPME).

1.4 SOF (Stuck-Open Fault):
A SOF is caused by an inaccessible cell or an inaccessible set of cells; e.g., as will be the case when a word-line is broken. The sense amplifier (SA) cannot produce the correct contents of the accessed cell(s) and/or the write driver cannot write the correct value(s) into the cell(s). Upon reading a cell with a SOF the following read-result may be produced:
A fixed value (FV).
The SOF behaves as a SAF; i.e., as <0/1> or as <1/0>.
The previous value (PV) of the SA.
This is caused by remnant charge in the SA.
These are the faults: <0/?$_p$> and <1/?$_p$>. The "?" denotes that by reading the cell a random (not Predictable) data value is produced.
The detection requires a test whereby in a single ME a 0 and a 1 is read. For example: ( . . . ,rx, . . . ,rx*), for x=0 and ( . . . ,rx*, . . . ,rx),for x=1. "x" is the data value in the cell, and "x*" is the inverse of that data value.
Random result (RR), caused by a read operation whereby the two inputs of the SA have the same value. This is the fault: <?/?$_R$>; "?$_R$" means read operations produce a random read-result.
This fault can only be detected probabilistically. E.g., a test my perform 20 read operations, then the probability for an escape is: $2^{-20}$.

The sensitization and detection do not depend on:
The address order (AO); i.e., ⇑ or ⇓.
The address direction (AD); i.e., Fast-Row or Fast-Column ($_C\Downarrow$)
The counting method (CM); e.g., the linear CM ($^{Li}\Downarrow$).
The operations per March element (OPME).

2. Two-Cell Faults: Coupling faults (CFs)

Two-cell faults (CFs) involve two cells: an aggressor cell and a victim cell. Notation: <a;v>, the ";" symbol separates the sensitizing operation of the aggressor from the fault-effect in the victim.

The set of CFs consists of idempotent CFs (CFid) and state CFs (CFst), which are described in the following.

2.1 Idempotent CF (CFid):

The definition of the CFid is as follows: A change in the a-cell forces the state in the v-cell.

The CFid has 4 subtypes: $<\uparrow;0>$, $<\uparrow;1>$, $<\downarrow;0>$, and $<\downarrow;1>$.

Each subtype has two positions:
  The address of the a-cell< the address of the v-cell.
    Notation: $_{av}<\text{-};\text{-}>$.
  The address of the a-cell> the address of the v-cell.
    Notation: $_{va}<\text{-};\text{-}>$.

Hence, in total, 8 subclasses can be recognized.

A test has for the $CFid_{va}<\downarrow;0>$ has to condition the v-cell by having the data-value "1" in the v-cell, followed by a $\downarrow$ transition-write in the a-cell to sensitize the fault, followed by reading the v-cell with expected value "1". This can be detected e.g. by the algorithm: $\{\Updownarrow(w1);\Uparrow(r1,w0)\}$.

Similarly, the fault $CFid_{av}<\downarrow;0>$ (the address of the-cell is lower than the address of the v-cell.) can be detected e.g. by the algorithm: $\{\Updownarrow(w1);\Downarrow(r1,w0)\}$.

A similar approach can be followed for the 6 remaining 6 faults.

The sensitization and detection do not depend on:
  The data background (DB); i.e., sDB, bDB, rDB, cDB or aDB.
  The address direction (AD); e.g., Fast-Row or Fast-Column ($_C\Downarrow$).

2.2 State CF (CFst):

The state of the a-cell forces the state of the v-cell.

The CFst has 4 subtypes: <1;0>, <1;1>, <0;0> and <0;1>.

Each subtype has two positions:
  The address of the a-cell< the address of the v-cell.
    Notation: $_{av}<\text{-};\text{-}>$.
  The address of the a-cell> the address of the v-cell.
    Notation: $_{va}<\text{-};\text{-}>$.

Hence, in total, 8 subclasses can be recognized.

A test has for the $CFst_{va}<1;0>$ has to have a 1-value in the a-cell, after which the v-cell is forced to a 0, or in case it was already a 0, it cannot be changed to a 1.

E.g., the test $\{\Updownarrow(w1);\Downarrow(r1)\}$ is able to detect this fault.

The sensitization and detection do not depend on:
  The address direction (AD); i.e., Fast-Row or Fast-Column ($_C\Downarrow$).
  The counting method (CM); e.g., the linear CM ($^{Li}\Downarrow$).

3. Speed-Related Faults

These faults are caused by the fact that the memory does not meet its speed requirements.

Two classes of speed-related faults can be recognized:
Strong faults

These are faults caused by a strong (large) defect. Such a defect is large enough to cause a large delay which can be detected by regular tests.

Weak faults

These faults are caused by weak defects. Such defects are too small to be detected by a regular memory test.

However, a path through the memory may contain several weak defects such that together they may cause a speed-related fault. For example a weak defect in the address decoder, a weak defect in the memory cell array and a weak defect in the write or read circuitry may together accumulate to a strong fault and, hence, be detectable, provided the weak defects are on the path of the read or write operation.

A test to cover such weak defects has to cover all paths through the memory. An example is the GALPAT test which, however, has a Test Length (TL) of Order $n^2$ (n=the number of cells in the memory).

A shorter version is MOVI (moving inversion), which has a TL of Order $n^{3/2}$. However, this test does not cover all speed-related faults and needs special hardware support in order to generate the proper address sequences.

The use of the Fast-Column address counting method (addressing $_C\Uparrow$ or $_C\Downarrow$) allows detecting some speed-related faults, but only when the defect is almost a strong fault. This is due to the fact that Fast-Column addressing causes a high frequency of bit-line (BL) switching. Given the weak signals on the BLs, the sense amplifiers will see a marginal difference between the signal levels on the True-BL and the False-BL, which may produce a wrong read-result.

4. Address Decoder Faults (AFs)

A fault in the addressing path, referred to as an Address decoder Fault (AF), may cause any of the following 4 errors:

1. SANC AF: Single Address, No Cell. Notation: <X->, address X does not address anything (denoted by "-"). This behaves as a SOF, which has a detectability of 50%.

2. SAMC AF: Single Address, Multiple Cells. Notation: <X-,Yxy>, address X does not address anything, while address Y addresses cell-x and cell-y. Upper-case characters denote addresses, lower-case characters denote cells.

3. MASC AF: Multiple Addresses, Single Cell. Notation: <Xx, Yx> (both address X and address Y access cell-x). Notation: <

4. MAMC AF: Multiple Addresses, Multiple Cells. Notation: <Xx, Yxy> (both address X and address Y access cell-x, while address Y also address cell-y). Read operation to address Y may produce a random result.

In order for a March test to detect the above 4 types of AFs, it has to satisfy the following Condition AF.

Condition AF: A march test has to contain at least the following two MEs:
  a. $\Uparrow$ (rx, . . . ,wx*,rx*). wx* means write Not-x.
  b. $\Downarrow$ (rx*, . . . ,wx,rx).

The sensitization and detection do not depend on:
  The Data Background (DB); i.e., sDB, bDB, rDB, cDB or aDB.
  The Address Direction (AD); i.e., Fast-Row or Fast-Column ($_C\Downarrow$).
  The Counting Method (CM); e.g., the Linear CM ($^{Li}\Downarrow$).

According to one embodiment, a test method (referred to as test method C or TMC) is used which is based on the following assumptions:

1. A non-destructive test is used; i.e., the existing memory contents are not lost as result of the test.

2. The CM (Counting Method) is the linear CM; e.g., $^{Li}\Uparrow$ or $^{Li}\Downarrow$.

3. Address scrambling (physical memory locations differ from the logical memory locations) is not taken into account. Because blocks of 64 Word Lines (WLs) are linearly organized (hence, these are not scrambled).

4. Fast-column addressing ($_C\Uparrow$) as well as fast-row ($_R\Uparrow$) addressing may be used.

5. The test method can only use the already present memory data (i.e., aDB and a*DB have to be used).

6. The test algorithm of the test method (i.e. of the test) can be seen to correspond to March C+(with random data background) with an optional ME shown in the bracket pair "[ ]".

$\{^{Li}\Uparrow$ (ra,wra*,ra*)$;^{Li}\Uparrow$ *,wra,ra$;^{Li}\Downarrow$ (ra,wra* ra*)$;^{Li}\Downarrow$ (ra*wrara*); ($[^{Li}\Uparrow$ (ra,wra*,ra*,wra)]$\}$.

7. The test algorithm may use fast-row ($_R\Uparrow$) or fast-column ($_C\Uparrow$) addressing.

8. The ECC bits cannot be controlled during the test.

In the following, an analysis of the fault coverage of this test method is given.

The fault analysis uses the above fault models, modified to reflect the notation of the applied tests. For example, the data background aDB (application-specific DB) is such an example. The 0-value for aDB is a, while the complement value is a*. Hence the operation wrl is written as wra*. This notation allows for ease of reference of the DB with the applied algorithm of TMA.

Similarly the notation for faults is modified. For example the SAF <0/1> is written as <a/a*>(in short: <0/1>=<a/a*>).

This section first analyzes de Fault Coverage (FC) of each of the faults 1. to 4. given above followed by a summary table (table 1). It therefore follows the structure of the above list of faults, which is as follows:

1 Single-cell faults: SAF, TF, DRF, SOF.
2 Two-cell faults (Coupling Faults) CFs: CFid, CFst.
3 Speed-related faults.
4 Address decoder Faults (AFs).

As mentioned above, the applied test algorithm can be seen to correspond to March C+, with an optional ME shown in the bracket-pair "[ ]".

The labels A0 through E3 identify each of the operations of the test; this facilitates the analysis.

$\{\Uparrow$ (ra,wra*,ra*)$;^{Li}\Uparrow$ (ra*,wra,ra)$;^{Li}\Downarrow$ (ra,wra*, ra*)$;^{Li}\Downarrow$ (ra*,wra,ra);$[^{Li}\Uparrow$ (ra,wra*,ra*,wra)]$\}$

A0 A1 A2 B0 B1 B2 C0 C1 C2 D0 D1 D2 E0 E1 E2 E3

In addition the following three additional acronyms are used:
SE=denotes SEnsitized.
DE=denotes DEtected.
DE=-- denotes NOT detected.

1. Single-Cell Faults

The fault is sensitized by an operation on the a-cell, or the state of the a-cell, while it is detected by a read operation on the v-cell. The a-cell and v-cell may have two relative positions in the memory:

The a-cell has a lower address than the v-cell; denoted by the subscript "av", as e.g. $_{av}$<0/1>.

The a-cell has a higher address than the v-cell; denoted by the subscript "va", as e.g., $_{va}$<0/1>.

1.1 SAFs

The test March C+ with the optional ME detects all SAFs, as follows:

It should be noted that SAFs are sensitized by a state; hence they do not require specific sensitizing operations.

The used algorithm detects all SAFs, as follows:
<0/1>=<a/a*>: SE=NN; DE=A0. SE=NN means: SEnsitization Not Needed.
<1/0>=<a*/a>: SE=NN; DE=B0.
<a/a*> is the notation for the fault <0/1>, assuming that the memory is in initial state a.

The sensitization and detection do not depend on:
The data background (DB); i.e., sDB, bDB, rDB, cDB or aDB.
The address direction (AD); i.e., Fast-Row or Fast-Column ($_C\Downarrow$).
The counting method (CM); e.g., the Li CM ($^{Li}\Downarrow$).

1.2 TFs

The test March C+ with the optional ME detects all TFs, as follows:
<↑/0>=<a→a*/a>: SE=A1; DE=A2.
<↓/1>=<a*→a/a*>: SE=B1; DE=B2.

The notation a→a* denotes that a makes an up-transition.

The sensitization and detection do not depend on:
The data background (DB); i.e., sDB, bDB, rDB, cDB or aDB.
The address direction (AD); i.e., Fast-Row or Fast-Column ($_C$∨).
The counting method (CM); i.e., the Li CM ($^{Li}\Downarrow$).

1.3 DRFs

The class of DRFs consists of two faults:
Fault <0$_T$/1>=<a$_T$→a*/a>
Fault <1$_T$/0>=<a*$_T$→a/a*>

Both faults are not detectable by the test because the DB cDB and a Delay ME are required.

1.4 SOFs

The subclasses of SOFs are determined by the output of the sense amplifier (SA) when producing a read-result. This can be:

A Fixed Value (FV).

The SOF behaves as a SAF; i.e., as <0/1>=<a/a*> or as <1/0>=<a*/a>.

Since the test detects all SAFs, the case FV is covered by for 100% by the test.

The previous value (PV) of the SA.

This is caused by remnant charge in the SA.

These are the faults: <0/?$_p$>=<a/?$_p$> and <1/?$_p$>=<a*/?$_p$>. The "?$_p$" denotes that by reading the cell a random (not predictable) data value is produced.

The detection requires a test whereby in a single ME a 0 and a 1 is read. ( . . . ,rx, . . . ,rx*), for x=0 and for x=1. "x" is the data value in the cell, and "x*" is the inverse of that data value.

Since the ME: $^{Li}_C\Uparrow$ (ra,wra*ra*,wra) can detect can detect 50% of the case "previous value" (for the other case a ME with the inverse data values is required, see Section 3.4) it will detect 50% of this subclass.

Random result (RR), caused by a read operation whereby the two inputs of the SA have the same value. This is the fault: <?/?$_R$>. "?$_R$" denotes the random read-result. This fault can only be detected probabilistically. E.g., a test my perform 20 read operations, then the probability for an escape is: $2^{-20}$.

This subclass requires a high number of read operations in order to have a high likelihood of being detected. Therefore, we this will be approximated as 0% detection.

In order to get a total picture of the detectability of the SOFs, the frequency of each of the 3 alternatives is estimated to be: 40% for "FV", 40% for "PV" and 20% for "RR". Assuming this, the detectability of SOFs is the following:
a. Fixed Value (FV): 100%*40%=40%.
b. Previous Value (PV): 50%*40%=20%.
c. Random Result (RR): 0%.
d. The above results in a total detectability of 60%.

The sensitization and detection do not depend on:
The address order (AO); i.e., ⇑ or ⇓.
The address direction (AD); i.e., Fast-Row or Fast-Column ($_C\Downarrow$)
The counting, method (CM); e.g., the linear CM ($^{Li}\Downarrow$).
The operations per March element (OPME).

2 Two-Cell Faults

The subclass consists of the CFids and the CFsts.

2.1 CFids

Only a limited number of the 8 subclasses of CFids are detectable by the test.

a. Fault $1_{av}$<↑;0>=$_{av}$<a→a*;a>: SE=C1; DE=D0. Detectable.

b. Fault $2_{av}$<↑;1>=$_{av}$<a→a*;a*>: SE=A1; DE=A0. Detectable.

c. Fault $3_{av}$<↓;0>=$_{av}$<a*→a;a>: SE=B1; DE=B0. Detectable.

d. Fault $4_{av}$<↓;1>=$_{av}$<a*→a;a*>: SE=E3; DE=E0. Detectable.

e. Fault $5_{va}$<↑;0>=$_{va}$<a→a*;a>: SE=A1; DE=B0. Detectable.

f. Fault $6_{va}$<↑;1>=$_{va}$<a→a*;a*>: SE=C1; DE=C0. Detectable.

g. Fault $7_{va}$<↓;0>=$_{va}$<a*→a;a>: SE=D1; DE=D. Detectable.

h. Fault $8_{va}$<↓;1>=$_{va}$<a*→a;a*>: SE=--; DE=Not detectable

The sensitization and detection do not depend on:

The address direction (AD); i.e., Fast-Row or Fast-Column ($_c$⇓)

2.2 CFsts

The state of the a-cell forces the state of the v-cell.

A test has for the CFst $_{va}$<1;0> has to have a 1-value in the a-cell, after which the v-cell is forced to a 0, or in case it was already a 0, it cannot be changed to a 1.

E.g., the test {⇕(w1);⇓(r1)} is able to detect this fault.

The CFst has 4 subtypes: <1;0>, <1;1>, <0;0> and <0;1>.

Each subtype has two positions:

The address of the a-cell< the address of the v-cell. Notation: $_{av}$<-;->.

The address of the a-cell> the address of the v-cell. Notation: $_{va}$<-;->.

Hence, in total, 8 subclasses can be recognized.

The sensitization and detection does not depend on:

The address direction (AD); i.e., Fast-Row or Fast-Column ($_c$⇓).

Below the analysis of the capability to detect each of the 8 subclasses of the CFst fault are analyzed.

a. Fault $1_{av}$<0;0>=$_{av}$<a;a>: SE=B1; DE=B0. Detectable.

b. Fault $2_{av}$<0;1>=$_{av}$<a;a*>: SE=E3; DE=E0. Detectable.

c. Faults $3_{av}$<1;0>=$_{av}$<a*;a>: SE=A1; DE=A0. Detectable.

d. Fault $4_{av}$<1;1>=$_{av}$<a;a*>: SE=A1; DE=A0. Detectable.

e. Fault $5_{va}$<0;0>=$_{va}$<a;a>: SE=D1; DE=D0. Detectable.

f. Fault $6_{va}$<0;1>=$_{va}$<a;a*>: SE=--; DE=--. Not detectable.

g. Fault $7_{va}$<1;0>=$_{va}$<a*;a>: SE=C1; DE=C0. Detectable.

h. Fault $8_{va}$<1;1>=$_{va}$<a;a*>: SE=C1; DE=C0. Detectable.

The sensitization and detection do not depend on:

The address direction (AD); i.e., Fast-Row or Fast-Column ($_c$⇓)

3. Speed-Related Faults

As shown above, the detection of speed-related faults requires special address sequences, required to generate the worst-case addressing sequences, because the delay caused in the addressing path due to decoder delays and delays on the column- and row select lines due to their length and capacitive coupling.

The test is not able to detect speed-related faults, because it uses the linear address counting method.

4. Address Decoder Faults (AFs)

In order for a March test to detect the 4 types of AFs (see Section 3.4), it has to satisfy the Condition AF.

Condition AF: A march test has to contain at least the following two MEs:

a. ⇑(rx, . . . ,wx*,rx*). wx* means write Not-x.

b. ⇓(rx*, . . . ,wx,rx).

The test satisfies Condition AF; hence all AFs are detected.

The sensitization and detection do not depend on:

The address order (AO); i.e., ⇑ or ⇓.

The data background (DB); i.e., sDB, bDB, rDB, cDB or aDB.

The address direction (AD); i.e., Fast-Row or Fast-Column ($_c$⇓).

The counting method (CM); e.g., the Linear CM ($^{Li}$⇓).

Table 1 summarizes the results for the faults presented above based on the test algorithm {⇑(ra,wra*,ra*);$^{Li}$⇑(ra*,wra,ra);$^{Li}$⇓(ra,wra*,ra*);$^{Li}$⇓(ra*,wra,ra);[$^{Li}$⇑(ra,wra*,ra*,wra)]}

A0 A1 A2 B0 B1 B2 C0 C1 C2 D0 D1 D2 E0 E1 E2 E3 of test method C.

Column 1 contains sequence numbers, for ease of reference.

Column 2 contains the Fault Model name.

Column 3 contains the subclasses of the fault model, in logic notation.

Column 4 column lists the notation of the faults, assuming the test

Column 5 column lists the Fault Coverage (FC) for each of the subclasses.

Column 6 lists the FC for each Fault Model.

It should be noted that in table 1 no assumptions are made on the relative frequency, or absolute frequency, of occurrence of each of the fault models of column 2.

Row 34 shows the total FC of 535 out of a potential FC of 700 (assuming that all Fault Models are equally likely to occur).

TABLE 1

Summary of Fault Coverage using Test Method C (TMC)

Theoretical fault description

| # | Fault Model | SubClass | Description using the ME of TMC SubClass | FC | FC |
|---|---|---|---|---|---|
| 1 | SAF | | | | 100 |
| 2 | | <0/1> | <a/a*> | 100 | |
| 3 | | <1/0> | <a*/a> | 100 | |
| 4 | TF | | | | 100 |
| 5 | | <↑/0> | <a→a*/a> | 100 | |
| 6 | | <↓/1> | <a*→a/a*> | 100 | |
| 7 | DRF | | | | 0 |
| 8 | | <0$_T$/1> | <a$_T$→a*/a> | 0 | |
| 9 | | <1$_T$/0> | <a*$_T$→a/a*> | 0 | |
| 10 | SOF | | | | 60 |
| 11 | | Fixed Value | FV | 100*40 = 40 | |
| 12 | | Previous Value | PV | 50*40 = 20 | |
| 13 | | Random Result | RR | 0 | |
| 14 | CFid | | | | 87.5 |
| 15 | | $_{av}$<↑; 0> | $_{av}$<a→a*; a> | 100 | |
| 16 | | $_{av}$<↑; 1> | $_{av}$<a→a*; a*> | 100 | |
| 17 | | $_{av}$<↓; 0> | $_{av}$<a*→a; a> | 100 | |
| 18 | | $_{av}$<↓; 1> | $_{av}$<a*→a; a*> | 100 | |
| 16 | | $_{va}$<↑; 0> | $_{va}$<a→a*; a> | 100 | |
| 19 | | $_{va}$<↑; 1> | $_{va}$<a→a*; a*> | 100 | |

TABLE 1-continued

Summary of Fault Coverage using Test Method C (TMC)

Theoretical fault description

| # | Fault Model | SubClass | Description using the ME of TMC SubClass | FC | FC |
|---|---|---|---|---|---|
| 20 | | $_{va}$<↓; 0> | $_{va}$<a*→a; a> | 100 | |
| 21 | | $_{va}$<↓; 1> | $_{va}$<a*→a; a*> | 0 | |
| 22 | CFst | | | | 87.5 |
| 23 | | $_{av}$<0; 0> | $_{av}$<a; a> | 100 | |
| 24 | | $_{av}$<0; 1> | $_{av}$<a; a*> | 100 | |
| 25 | | $_{av}$<1; 0> | $_{av}$<a*; a> | 100 | |
| 26 | | $_{av}$<1; 1> | $_{av}$<a*; a*> | 100 | |
| 27 | | $_{va}$<0; 0> | $_{va}$<a; a> | 100 | |
| 28 | | $_{va}$<0; 1> | $_{va}$<a; a*> | 0 | |
| 29 | | $_{va}$<1; 0> | $_{va}$<a*; a> | 100 | |
| 30 | | $_{va}$<1; 1> | $_{va}$<a*; a*> | 100 | |
| 31 | AF | | | | 100 |
| 32 | | Cond. AFa | ⇑ (rx, . . . , wx*, rx*) | 100 | |
| 33 | | Cond. AFb | ⇓ (rx*, . . . , wx, rx) | 100 | |
| 34 | | | Total FC is 535 out of 700 | | |

Test method C can be seen to be based on March elements according to which, for each word cell (also referred to as data word memory):

a data word stored in the data word memory is read;

check the read data word to detect an error of the memory device;

a complementary data word of the data word is determined;

the complementary data word is stored in the data word memory;

the complementary data word is read from the data word memory; and the read complementary data word is checked to detect an error of the memory device.

Figure 3:
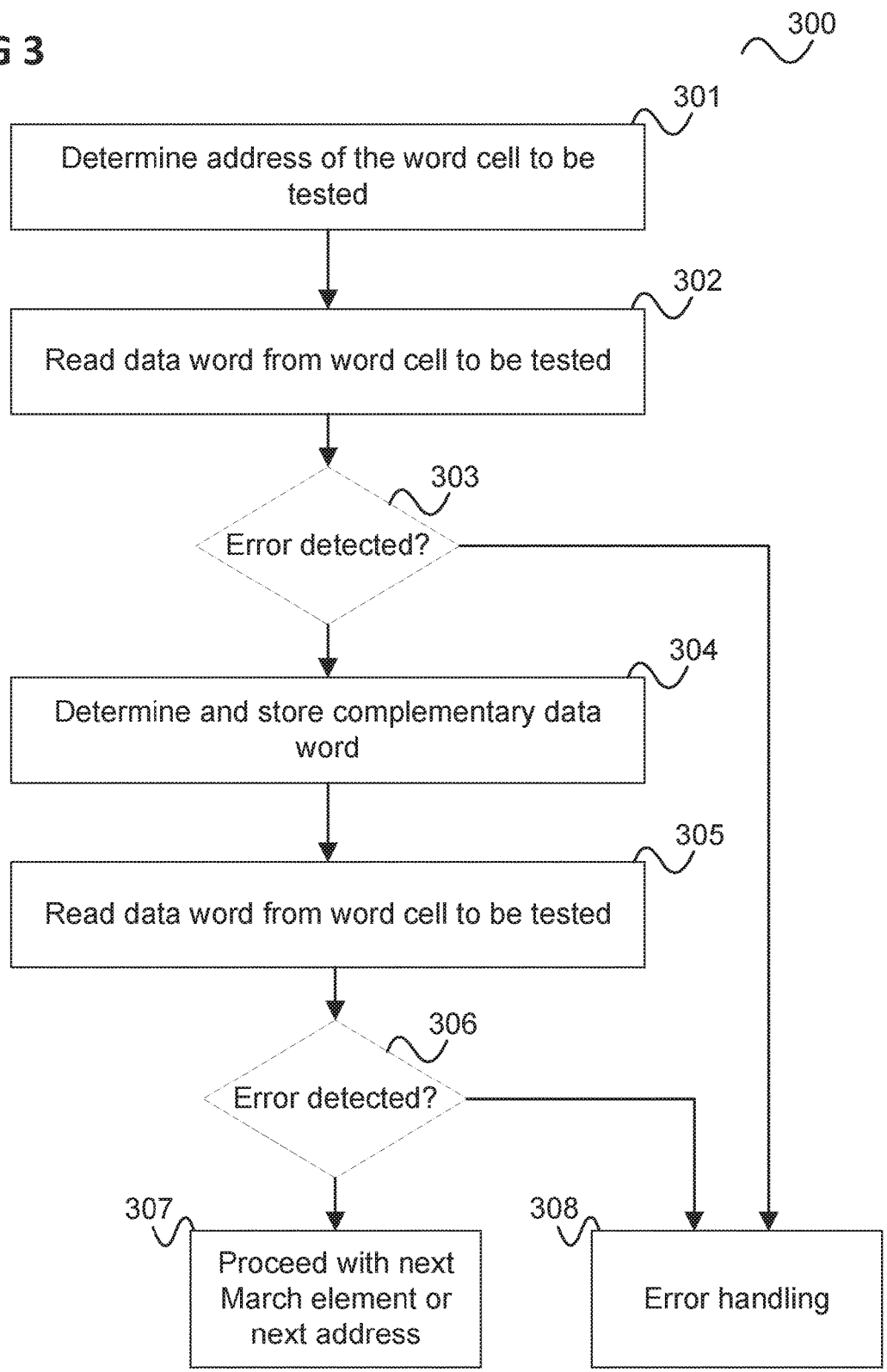
FIG. 3 shows a flow diagram illustrating the test processing for a word cell according to an exemplary March element.

FIG. 3 shows a flow diagram 300 illustrating, as example, the test processing for a word cell according to the first March element $^{Li}$⇑(ra,wra*,ra*) of test method C.

The test processing is for example carried out by the test controller 102.

In 301, the address of the word cell to be tested is determined according to the counting method (e.g. by an address counter of the test controller 102), in this example linear counting method for the the ⇑ (i.e. upward) direction.

In 302, the data word a stored in the word cell is read (e.g. via a read interface between the test controller 102 and the memory 101). This data word is, from the point of view of the test, unknown and should not be destroyed by the test.

In 303, the data word a is checked for errors. Since the data word a is unknown, this is done based on the ECC bits for the data word (e.g. by an ECC testing circuit of the test controller 102). As mentioned above, the ECC bits can be considered to be part of the data word or may be considered to be stored in addition to the data word in the word cell.

If an error is detected, an error processing procedure is initiated in 308. This may include an attempt to correct the error, the generation of an error signal or output of an error signal of the electronic device containing the memory etc.

The processing of 302 and 303 corresponds to the March operation "ra".

In 304, assuming that no error has been detected for the data word a, the complementary data word of data word a, which is denoted by a*, is determined (e.g. by means of a bit inverter of the test controller 102). The complementary data word a* to the data word a is understood as the data word a with each bit being inverted, i.e. each 1 being replaced by a 0 and each 0 being replaced by a 1. The complementary data word is stored in the word cell (e.g. via a write interface between the test controller 102 and the memory 101).

As mentioned above, this may or may not include inverting the ECC bits depending on whether the ECC bits are considered to be part of the data word. For example, one of the following may be applied:

a) If inverting data bits and ECC bits yields an ECC-correct data word, all checks can be done using the standard ECC checker unit of the test controller 102.

b) If the simple inverse is not ECC correct, b1) replace ECC bit by a valid ECC code. Then Error checking can be done the same way as for non-inverted data using ECC error detection logic of the test controller 102. However, some test coverage on the ECC bits is lost in this way.

b2) invert ECC bits yielding ECC incorrect data in the memory (only) for the inverse b21) and invert the read data (including the ECC bits) prior to sending them to the ECC checker unit b22) and store the inverse data word in the test controller 102 when writing it to the memory and use it for direct comparison when reading the data word from the memory within the same march element. This is however only possible for March elements where the inverse data is checked immediately and not within the next March element.

The processing of 304 corresponds to the March operation wra*.

In 305, the data word that has been written is read from the word cell (e.g. via a read interface between the test controller 102 and the memory 101). This data word is denoted by a*' which is, if there is no error, equal to a*.

In 306, the data word a*' is checked for errors. This may be done by checking whether the data word a*' is equal to the complementary data word a* that has been written (which, may, however, require additional hardware in the test controller 102 supporting a comparison). Alternatively, the ECC bits of the data word a*' may be used to check the data word a*' for errors (using ECC checking hardware present in the test controller, e.g. for performing the ECC checking in 304). If the ECC bits have been considered to be part of the data word a and thus have been inverted together with the data word a, the ECC checking may for example be done by inverting the read data word a*', i.e. forming the complementary data word (a*')* and checking whether the ECC bits (i.e. the bits at the ECC bit positions) are correct for this data word. Depending on the code used, the checking may also be done by checking whether the the ECC bits (i.e. the bits at the ECC bit positions) of the read data word a*' are correct for the rest (i.e. the bits at the payload positions) of the read data word a*'. This requires that the code contains for each code word also the complementary code word.

If the ECC bits have not been considered to be part of the data word a and thus have not been inverted together with the data word a, the checking may similarly be done by inverting the read data word a*', i.e. forming the complementary data word (a*')* and checking whether the (original) ECC bits are correct for this data word.

If an error is detected, the error processing procedure is initiated in 308.

The processing of 305 and 306 corresponds to the March operation ra*.

If no error has been detected, the processing continues with the next March element in 307.

It should be noted that in test method C, the March element $^{Li}\Uparrow$ (ra,wra*,ra*) is followed by $^{Li}\Uparrow$ (ra*,wra,ra) such that, if no error occurs, the word cell again contains the original data word a.

The processing is similar for the other March elements of TMC wherein for the last March element ($^{Li}\Downarrow$ (ra*,wra,ra) or, if applied, $^{Li}\Uparrow$ (ra,wra*,ra*,wra)) the processing continues for the next word cell in 307.

For comparison, table 2 shows the results for a test method (referred to as test method A or TMA) based on the following:

1. Prior to the test, the memory is filled with application-specific data, which can be any data and which can differ from word to word. This DB is referred to as aDB; i.e., application-specific DB.

2. After the test the DB should be the aDB as existed before the test.

3. The CM (Counting Method) is the linear CM; e.g., $^{Li}\Uparrow$ or $^{Li}\Downarrow$.

4. Address scrambling is not taken into account. Because blocks of 64 word lines (WLs) are linearly organized (hence, these are not scrambled).

5. Fast column addressing will be used ($_C\Uparrow$).

6. The applied test consists of a single ME: $^{Li}_C\Uparrow$ (ra,wra*, ra*,wra).

7. The ECC bits cannot be controlled during the test.

TABLE 2

Summary of Fault Coverage using Test Method A (TMA)

Theoretical fault description

| # | Fault Model | SubClass | Description using the ME of TMA SubClass | FC | FC |
|---|---|---|---|---|---|
| 1 | SAF | | | | 100 |
| 2 | | <0/1> | <a/a*> | 100 | |
| 3 | | <1/0> | <a*/a> | 100 | |
| 4 | TF | | | | 50 |
| 5 | | <↑/0> | <a→a*/a> | 100 | |
| 6 | | <↓/1> | <a*→a/a*> | 0 | |
| 7 | DRF | | | | 0 |
| 8 | | <0$_T$/1> | <a$_T$→a*/a> | 0 | |
| 9 | | <1$_T$/0> | <a*$_T$→a/a*> | 0 | |
| 10 | SOF | | | | 60 |
| 11 | | Fixed Value | FV | 100*40 = 40 | |
| 12 | | Previous Value | PV | 50*40 = 20 | |
| 13 | | Random Result | RR | 0 | |
| 14 | CFid | | | | 25 |
| 15 | | $_{av}$<↑; 0> | $_{av}$<a→a*; a> | 0 | |
| 16 | | $_{av}$<↑; 1> | $_{av}$<a→a*; a*> | 100 | |
| 17 | | $_{av}$<↓; 0> | $_{av}$<a*→a; a> | 0 | |
| 18 | | $_{av}$<↓; 1> | $_{av}$<a*→a; a*> | 100 | |
| 16 | | $_{va}$<↑; 0> | $_{va}$<a→a*; a> | 0 | |
| 19 | | $_{va}$<↑; 1> | $_{va}$<a→a*; a*> | 0 | |
| 20 | | $_{va}$<↓; 0> | $_{va}$<a*→a; a> | 0 | |
| 21 | | $_{va}$<↓; 1> | $_{va}$<a*→a; a*> | 0 | |
| 22 | CFst | | | | 25 |
| 23 | | $_{av}$<0; 0> | $_{av}$<a; a> | 0 | |
| 24 | | $_{av}$<0; 1> | $_{av}$<a; a*> | 100 | |
| 25 | | $_{av}$<1; 0> | $_{av}$<a*; a> | 0 | |
| 26 | | $_{av}$<1; 1> | $_{av}$<a*; a*> | 100 | |
| 27 | | $_{va}$<0; 0> | $_{va}$<a; a> | 0 | |
| 28 | | $_{va}$<0; 1> | $_{va}$<a; a*> | 0 | |
| 29 | | $_{va}$<1; 0> | $_{va}$<a*; a> | 0 | |
| 30 | | $_{va}$<1; 1> | $_{va}$<a*; a*> | 0 | |
| 31 | AF | | | | 50 |

TABLE 2-continued

Summary of Fault Coverage using Test Method A (TMA)

Theoretical fault description

| # | Fault Model | SubClass | Description using the ME of TMA SubClass | FC | FC |
|---|---|---|---|---|---|
| 32 | | Cond. AFa | $\Uparrow$(rx, ..., wx*, rx*) | 100 | |
| 33 | | Cond. AFb | $\Downarrow$(rx*, ..., wx, rx) | 0 | |
| 34 | | | Total FC is 310 out of 700 | | |

Figure 4:
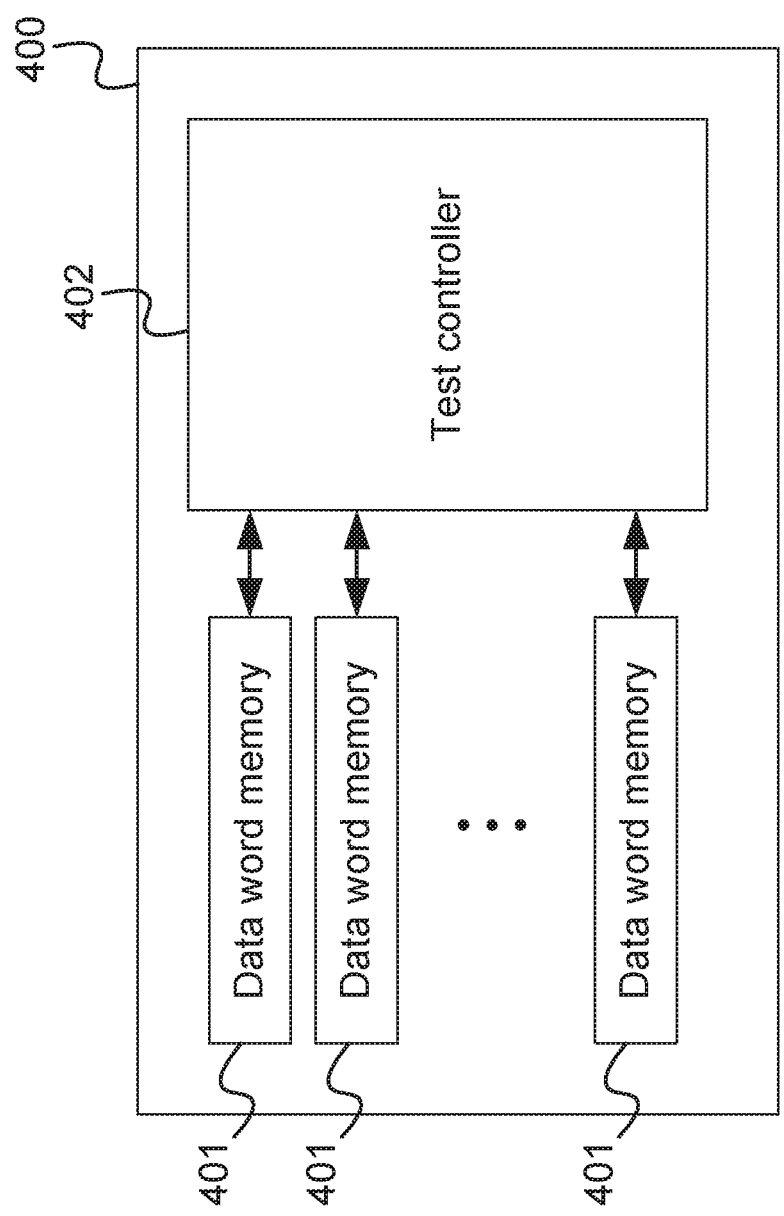
FIG. 4 shows a memory device according to an embodiment.

In summary, according to various embodiments, a memory device is provided as illustrated in FIG. 4.

FIG. 4 shows a memory device 400.

The memory device 400 includes a plurality of data word memories 401.

The memory device 400 further includes a test controller 402 configured to, for each data word memory 401 read a data word stored in the data word memory 401, check the read data word to detect an error of the memory device, determine a complementary data word of the data word, store the complementary data word in the data word memory 401, read the complementary data word from the data word memory 401 and check the read complementary data word to detect an error of the memory device 400.

According to various embodiments, in other words, for each data word stored in a data word memory (i.e. a word cell), its complement is stored in the word cell, is read again from the word cell and the read complementary data word (which, in case of an error, may differ from the stored complementary data word) is checked for errors to detect an error of the memory device. The complementary word of the data word is determined individually for the data word. In other words, the complementary data word is determined based on the data word, e.g. by inverting each bit value of the data word. Accordingly, the determination and storage of the complementary data word is for example not to be understood to the storage of a predetermined data word which is, by coincidence, the complement of the data word.

The test controller may be configured to perform the processing of reading a data word stored in the data word memory, determine a complementary data word of the data word, store the complementary data word in the data word memory, reading the complementary data word from the data word memory and check the read complementary data word to detect an error of the memory device again such that as a result, if no errors have occurred) the original data word is again stored in the data word memory. The test controller may thus, according to one embodiment, be seen to implement a test which combines a test which would as such be destructive with a non-destructive test approach, in this example by writing words depending on the words which have been stored and performing the determination and storing of complementary words two times (or an even number of times) successively.

It should be noted that the test controller may perform further operations for the data word memory to detect an error of the memory device (e.g. store further data in the data word memory and check further data stored in the data word memory).

An example for a destructive test procedure includes writing a specific regular pattern (data backgrounds) to the memory array and reading them back. This process changes the original content of the memory.

An example is March C+ which does the following sequence
1. Up WR0
2. Up RD0 WR1 RD1
3. Up RD1 WR0 RD0
4. Dn RD0 WR1 RD1
5. Dn RD1 WR0 RD0
6. Dn RD0

(wherein Up refers to counting up an address, Dn refers to counting down an address and WR0/1 and RD0/1 refer to writing a 0/1 or a reading a 0/1, respectively).

In non-destructive testing the data content after the test is identical to the content before. This may be achieved by
1. reading a data word and checking for correct ECC
2. writing back the inverse of that data word with valid ECC
3. reading and (optionally comparing if the read data word is really the inverse and) check whether it has correct ECC
4. writing back the original data
5. reading the original data and check if it still has correct ECC However, this test method has a low test coverage compared to the destructive test using a March C+ Algorithm.

According to various embodiments, a non-destructive test is used which leaves the memory behind in the inverted state, after performing the sequence
1. reading a data word and checking for correct ECC;
2. writing back the inverse of that data word with valid ECC;
3. reading and comparing if the read data word is really the inverse and has correct ECC.

If this test is executed twice, it restores the original memory content and thus fulfills the basic requirement of a non-destructive test.

By splitting up the test into two March elements, it is possible to execute the exact sequence of the March C+ Algorithm resulting in what is referred to as non-destructive test (NDT) March C+ algorithm. The only difference is that destructive MarchC+ works on defined data backgrounds which target certain cell coupling faults, while NDT MarchC+ works with a random and unpredictable data background and therefore cannot detect certain corner cases of faults.

Figure 5:
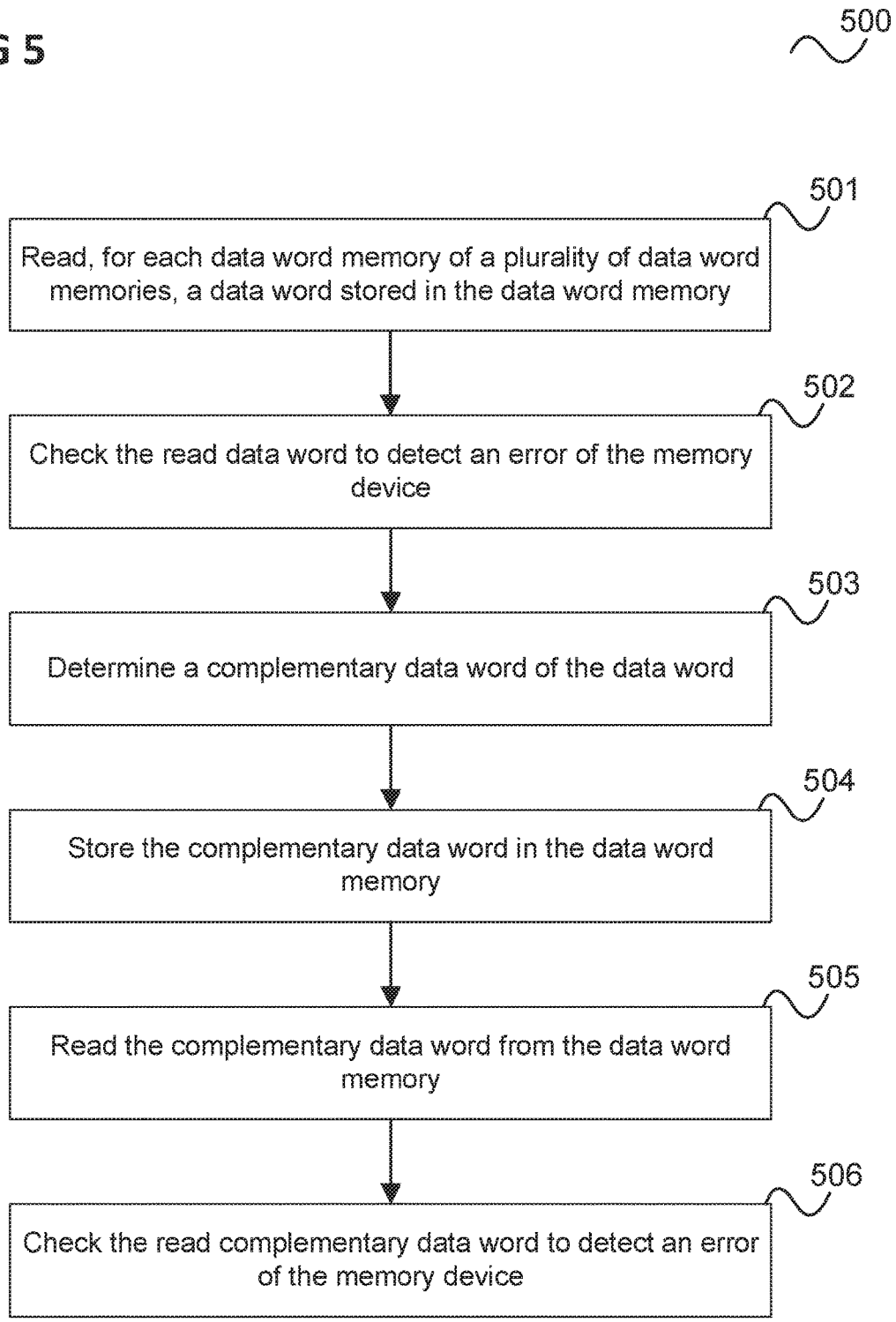
FIG. 5 shows a flow diagram illustrating a method for testing a memory device according to an embodiment.

The memory device for 400 for example performs a method for testing a memory device as illustrated in FIG. 5.

FIG. 5 shows a flow diagram 500.

In 501, for each data word memory of a plurality of data word memories, a data word stored in the data word memory is read.

In 502, the read data word is checked to detect an error of the memory device.

In 503, a complementary data word of the data word is determined.

In 504, the complementary data word is stored in the data word memory.

In 505, the complementary data word is read from the data word memory.

In 506, the read complementary data word is checked to detect an error of the memory device.

In the following, further embodiments are described.

Embodiment 1 is a memory device as illustrated in FIG. 4.

Embodiment 2 is the memory device according to Embodiment 1, wherein the data word includes error correction bits and the test controller is configured to check whether the read complementary data word has an error based on error correction bits of the read complementary data word (which may be generated by the test controller by the based on the error correction words of the data word, e.g. by inversion of the error correction words of the data word, e.g. depending on whether the error correction code used allows this, or are generated by the test controller for the complementary data word according to the code, e.g. when determining the complementary data word).

Embodiment 3 is the memory device according to Embodiment 2, wherein the test controller is configured to check whether the read complementary data word has an error by checking whether the error correction bits of the read complementary data word are valid error correction bits for the rest of the read complementary data word.

Embodiment 4 is the memory device according to Embodiment 1, wherein each data word memory stores, for the data word, error correction bits and the test controller is configured to check whether the read complementary data word has an error based on the error correction bits stored in the data word memory.

Embodiment 5 is the memory device according to Embodiment 4, wherein the test controller is configured to check whether the read complementary data word has an error by inverting the read complementary data word and checking whether the error correction bits are valid error correction bits for the inverted read complementary data word.

Embodiment 6 is the memory device according to any one of Embodiments 1 to 5, wherein each data word memory is a word cell including a plurality of bit cells.

Embodiment 7 is the memory device according to Embodiment 6, wherein each bit cell is configured to store one bit.

Embodiment 8 is the memory device according to any one of Embodiments 1 to 7, wherein each data word memory is configured to store payload bits and error correction bits for the payload bits.

Embodiment 9 is the memory device according to any one of Embodiments 1 to 8, wherein the test controller is further configured to, after reading the complementary data word from the data word memory, storing the data word in the data word memory.

Embodiment 10 is the memory device according to any one of Embodiments 1 to 9, wherein the test controller is configured to, for each data word memory, perform a sequence including reading a data word stored in the data word memory, determining a complementary data word of the data word, storing the complementary data word in the data word memory, reading the complementary data word from the data word memory and checking the read complementary data word to detect an error of the memory device an even amount of times for the data word memory.

Embodiment 11 is the memory device according to any one of Embodiments 1 to 10, wherein the test controller is configured to determine the complementary data word of the data word depending on the data word.

Embodiment 12 is the memory device according to any one of Embodiments 1 to 11, wherein the test controller is configured to determine the complementary data word of the data word by inverting each bit of the data word.

Embodiment 13 is the memory device according to any one of Embodiments 1 to 12, wherein the data words are random.

Embodiment 14 is the memory device according to any one of Embodiments 1 to 13, wherein the test controller is configured to check the read complementary data word to detect an error of the memory device by comparing the stored complementary data word with the read complementary data word.

Embodiment 15 is the memory device according to any one of Embodiments 1 to 14, wherein the memory device includes a memory including the plurality of data word memories.

Embodiment 16 is the memory device according to Embodiment 15, wherein the memory is a static random access memory.

Embodiment 17 is the memory device according to any one of Embodiments 1 to 16, wherein the memory device further includes a central processing unit configured to control the test controller.

Embodiment 18 is the memory device according to any one of Embodiments 1 to 17, wherein the test controller is configured to output an error signal when it detects an error.

Embodiment 19 is the memory device according to any one of Embodiments 1 to 18, wherein the data word includes error correction bits and the test controller is configured to check whether the read data word has an error based on the error correction bits of the read data word.

Embodiment 20 is the memory device according to Embodiment 19, wherein the test controller is configured to check whether the read data word has an error by checking whether the error correction bits are valid error correction bits for the rest of the read data word.

Embodiment 21 is a method as illustrated in FIG. 5.

It should be noted that embodiments based on the memory device 400 (i.e. Embodiment 1) are analogously valid for the method illustrated in FIG. 5 (i.e. Embodiment 21) and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory device, comprising:
a plurality of data word memories; and
a test controller configured to:
read a data word stored in a data word memory of the plurality of data word memories,
check the read data word to detect an error of the memory device,
determine a complementary data word of the data word in response to a determination that no error of the memory device is detected in the check of the read data word,
store the complementary data word in the data word memory,
read the complementary data word from the data word memory, and
check the read complementary data word to detect an error of the memory device.

2. The memory device of claim 1,
wherein the data word comprises error correction bits, and the test controller is configured to check whether the read complementary data word has an error based on error correction bits of the read complementary data word.

3. The memory device of claim 2,
wherein the test controller is configured to check whether the read complementary data word has an error by checking whether the error correction bits of the read complementary data word are valid error correction bits for the rest of the read complementary data word.

4. The memory device of claim 1,
wherein the data word memory stores error correction bits for the data word, and
the test controller is configured to check whether the read complementary data word has an error based on the error correction bits stored in the data word memory.

5. The memory device of claim 4,
wherein the test controller is configured to check whether the read complementary data word has an error by:
inverting the read complementary data word, and
checking whether the error correction bits are valid error correction bits for the inverted read complementary data word.

6. The memory device of claim 1,
wherein the data word memory is a word cell comprising a plurality of bit cells.

7. The memory device of claim 6,
wherein each bit cell of the plurality of bit cells is configured to store one respective bit.

8. The memory device of claim 1,
wherein the data word memory is configured to store payload bits and error correction bits for the payload bits.

9. The memory device of claim 1,
wherein the test controller is further configured to, after reading the complementary data word from the data word memory, store the data word in the data word memory.

10. The memory device of claim 1,
wherein the test controller is configured to determine the complementary data word of the data word by inverting each bit of the data word.

11. The memory device of claim 1,
wherein each data word memory of the plurality of data word memories stores a respective data word, and
the plurality of data words are random.

12. The memory device of claim 1,
wherein the test controller is configured to check the read complementary data word to detect an error of the memory device by comparing the stored complementary data word with the read complementary data word.

13. The memory device of claim 1, further comprising:
a memory comprising the plurality of data word memories.

14. The memory device of claim 13,
wherein the memory is a static random access memory.

15. The memory device of claim 1, further comprising:
a central processing unit configured to control the test controller.

16. The memory device of claim 1,
wherein the test controller is configured to output an error signal when it detects an error.

17. The memory device of claim 1,
wherein the data word comprises error correction bits, and the test controller is configured to check whether the read data word has an error based on the error correction bits of the read data word.

18. The memory device of claim 17,
wherein the test controller is configured to check whether the read data word has an error by checking whether the error correction bits are valid error correction bits for the rest of the read data word.

19. A method for testing a memory device including a plurality of data word memories and a test controller, the method comprising:
    reading, by the test controller, a data word stored in a data word memory of the plurality of data word memories;
    checking, by the test controller, the read data word to detect an error of the memory device;
    determining, by the test controller, a complementary data word of the data word in response to a determination that no error of the memory device is detected in said checking, by the test controller, the read data word;
    storing, by the test controller, the complementary data word in the data word memory;
    reading, by the test controller, the complementary data word from the data word memory; and
    checking, by the test controller, the read complementary data word to detect an error of the memory device.

20. A memory device, comprising:
    a plurality of data word memories; and
    a test controller configured to:
        read a data word stored in a data word memory of the plurality of data word memories,
        check the read data word to detect an error of the memory device,
        determine a complementary data word of the data word by inverting each bit of the data word,
        store the complementary data word in the data word memory,
        read the complementary data word from the data word memory, and
        check the read complementary data word to detect an error of the memory device.

21. A memory device, comprising:
a plurality of data word memories; and
a test controller configured to perform a test sequence for each data word memory of the plurality of data word memories,
wherein the test sequence for each data word memory includes:
    reading a data word stored in a respective data word memory of the plurality of data word memories,
    checking the read data word to detect an error of the memory device,
    determining a complementary data word of the data word,
    storing the complementary data word in the respective data word memory,
    reading the complementary data word from the respective data word memory, and
    checking the read complementary data word to detect an error of the memory device,
wherein the test sequence is performed an even number of times for each data word memory of the plurality of data word memories.

* * * * *